United States Patent
Hanada et al.

(10) Patent No.: US 9,780,227 B2
(45) Date of Patent: Oct. 3, 2017

(54) THIN-FILM TRANSISTOR AND METHOD OF MANUFACTURING THE SAME

(71) Applicant: Japan Display Inc., Minato-ku (JP)

(72) Inventors: Akihiro Hanada, Minato-ku (JP);
Masayoshi Fuchi, Minato-ku (JP);
Hajime Watakabe, Minato-ku (JP);
Takashi Okada, Minato-ku (JP);
Arichika Ishida, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/944,676

(22) Filed: Nov. 18, 2015

(65) Prior Publication Data

US 2016/0149046 A1    May 26, 2016

(30) Foreign Application Priority Data

Nov. 25, 2014   (JP) ................. 2014-237937

(51) Int. Cl.
| | |
|---|---|
| H01L 29/10 | (2006.01) |
| H01L 29/786 | (2006.01) |
| H01L 29/423 | (2006.01) |
| H01L 29/66 | (2006.01) |
| H01L 21/467 | (2006.01) |

(52) U.S. Cl.
CPC ........ *H01L 29/7869* (2013.01); *H01L 21/467* (2013.01); *H01L 29/42384* (2013.01); *H01L 29/66969* (2013.01)

(58) Field of Classification Search
CPC ........... H01L 29/7869; H01L 29/66969; H01L 29/42384; H01L 29/24
See application file for complete search history.

(56) References Cited

U.S. PATENT DOCUMENTS

| | | | |
|---|---|---|---|
| 2012/0241353 A1* | 9/2012 | Chang ................. | C23C 14/0084 206/524.2 |
| 2014/0284599 A1* | 9/2014 | Yamazaki ........... | H01L 29/7869 257/43 |
| 2016/0013243 A1* | 1/2016 | O'Rourke ......... | H01L 27/14603 257/43 |

FOREIGN PATENT DOCUMENTS

JP     2010-186994     8/2010

* cited by examiner

*Primary Examiner* — Dale E Page
*Assistant Examiner* — Wasiul Haider
(74) *Attorney, Agent, or Firm* — Oblon, McClelland, Maier & Neustadt, L.L.P.

(57) ABSTRACT

According to one embodiment, a thin-film transistor and a method of manufacturing the thin-film transistor provided herein achieve enhanced reliability by preventing a disconnection in a gate insulating film at a position corresponding to an end surface of an oxide semiconductor layer. The oxide semiconductor layer includes a channel region, a source region, and a drain region. The channel region is placed between the source region and the drain region. The gate insulating film covers the oxide semiconductor layer in a range from at least a part of an upper surface to an end surface continuous with the upper surface of the oxide semiconductor layer. The oxide semiconductor layer is formed so as to have an oxygen concentration that becomes lower from a top side to a bottom side and the end surface is inclined so as to diverge from the top side to the bottom side.

3 Claims, 2 Drawing Sheets

THIN-FILM TRANSISTOR AND METHOD OF MANUFACTURING THE SAME

INCORPORATION BY REFERENCE

The present invention claims priority under 35 U.S.C. §119 to Japanese Patent Application No. 2014-237937 filed on Nov. 25, 2014. The content of the application is incorporated herein by reference in its entirety.

FIELD

An embodiment described herein relates generally to a thin-film transistor including an oxide semiconductor layer and a method of manufacturing the thin-film transistor.

BACKGROUND

A thin-film transistor has conventionally been used in a flat panel display device such as a liquid crystal display device or an organic EL display device, for example. In recent years, a flat panel display device has been required to respond to increasing demands for a larger screen, a higher resolution, and a higher frame rate, etc. Some flat panel display devices use an oxide semiconductor layer that can achieve high mobility as a semiconductor layer of a thin-film transistor. In particular, an oxide semiconductor layer made of IGZO, for example, has gained attention as an oxide semiconductor layer satisfying the aforementioned demands as it can be formed in a large area under a relatively low temperature and consumes a small current.

Wet etching is generally used for patterning of such an oxide semiconductor layer. As a result of a high etching rate during wet etching, the shape of an end surface of the oxide semiconductor layer being formed cannot be controlled easily. Thus, the resultant end surface is not given a substantially inclined shape but becomes a vertical end surface. This may cause a phenomenon that is called a step disconnection where a covering layer such as an insulating film formed so as to cover the oxide semiconductor layer is disconnected at a position corresponding to the end surface of the oxide semiconductor layer.

DETAILED DESCRIPTION

Figure 1:
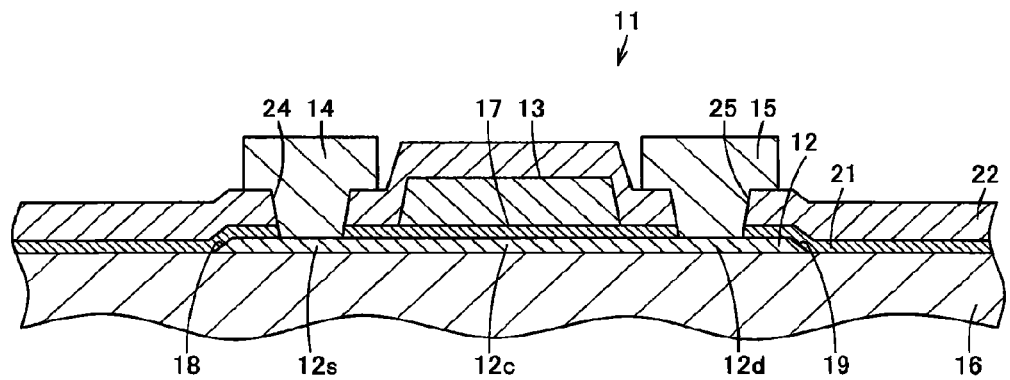
FIG. 1 is a sectional view schematically showing a thin-film transistor of an embodiment.

The structure of an embodiment is described below by referring to the drawings.

Referring to FIG. 1, 11 shows a thin-film transistor. The thin-film transistor 11 is a top gate thin-film transistor used in a flat panel display device such as a liquid crystal display device (LCD) or an organic EL display device, for example.

The thin-film transistor 11 includes an oxide semiconductor layer 12, a gate electrode 13, a source electrode 14, and a drain electrode 15. The thin-film transistor 11 is formed on an insulating undercoat layer not shown in the drawings that is formed on a glass substrate 16 as an insulating substrate.

The oxide semiconductor layer 12 is formed of an oxide containing at least one of indium (In), gallium (Ga), zinc (Zn), and tin (Sn). For example, the oxide semiconductor layer 12 may be made of IGZO. The oxide semiconductor layer 12 has a channel region 12c as a high-resistance region of a relatively high resistance formed into a given width in a central part of the oxide semiconductor layer 12. A source region 12s and a drain region 12d as low-resistance regions lower in resistance than the channel region 12c are formed while the channel region 12c is placed between the source region 12s and the drain region 12d. Further, the oxide semiconductor layer 12 has an oxide concentration gradient set in a manner such that an oxide concentration becomes lower continuously or stepwise from the top side to the bottom side (toward the glass substrate 16). The oxide semiconductor layer 12 has an inclined surface (tapered surface) that is inclined so as to diverge toward the glass substrate 16. The inclined surface is formed at each of an end surface 18 and an end surface 19 continuous with a planar upper surface 17, specifically, at each of an end portion of the source region 12s on an opposite side of an end portion thereof facing the channel region 12c and an end portion of the drain region 12d on an opposite side of an end portion thereof facing the channel region 12c. In this way, the oxide semiconductor layer 12 is formed into a tapered shape that expands from the top side to the bottom side, specifically, toward the glass substrate 16.

The gate electrode (gate metal) 13 is formed of an alloy containing one of, or at least one of copper (Cu), aluminum (Al), titanium (Ti), molybdenum (Mo), tungsten (W), tantalum (Ta), and chromium (Cr). The gate electrode 13 is formed on the gate insulating film 21 as a covering layer formed on the oxide semiconductor layer 12 at a position facing the channel region 12c of the oxide semiconductor layer 12, specifically, at a position directly above the channel region 12c. The gate electrode 13 is insulated from the oxide semiconductor layer 12 (channel region 12c) by the gate insulating film 21.

The gate insulating film 21 is a silicon oxide film or a silicon nitride film, or the like. The gate insulating film 21 is formed so as to cover the oxide semiconductor layer 12 in a range from the upper surface 17 to each of the end surfaces 18 and 19, specifically, so as to cover the oxide semiconductor layer 12 across the upper surface 17 and the end surfaces 18 and 19 continuously. Thus, the gate insulating film 21 has step portions formed at positions corresponding to a position on the end surfaces 18 and 19 of the oxide semiconductor layer 12.

The source electrode 14 and the drain electrode 15 are formed of an alloy containing one of, or at least one of copper (Cu), aluminum (Al), titanium (Ti), molybdenum (Mo), tungsten (W), tantalum (Ta), and chromium (Cr). The source electrode 14 and the drain electrode 15 are formed on an interlayer insulating film 22 that is formed on the gate insulating film 21 so as to cover the gate electrode 13, so that the source electrode 14 and the drain electrode 15 are insulated from the gate electrode 13. Further, the source electrode 14 and the drain electrode 15 are electrically connected to the source region 12s and the drain region 12d of the oxide semiconductor layer 12 through a contact hole 24 and a contact hole 25, each of which is respectively formed so as to extend through the gate insulating film 21 and the interlayer insulating film 22. In this way, the source electrode 14 and the drain electrode 15 are arranged at positions between which the gate electrode 13 is placed. The interlayer insulating film 22 is a silicon oxide film (SiO), for example.

A method of manufacturing the thin-film transistor 11 of the aforementioned first embodiment is described next.

Figure 2A:
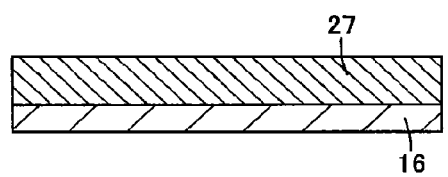
FIGS. 2A, 2B, 2C and 2D are sectional views schematically showing a part of a method of manufacturing the thin-film transistor in FIG. 1 in order from FIG. 2A to FIG. 2D.

First, an oxide semiconductor film 27 to become the oxide semiconductor layer 12 is deposited on the glass substrate by sputtering, for example (FIG. 2A). During the deposition, an oxygen flow rate is increased continuously or stepwise, thereby growing the oxide semiconductor film 27 while increasing an oxygen concentration in the oxide semiconductor film 27 continuously or stepwise from the bottom side to the top side, specifically from a side corresponding to the glass substrate 16. Therefore, the oxide semiconductor film 27 has an oxide concentration gradient set in a manner such that the oxide concentration becomes lower continuously or stepwise from the top side to the bottom side.

Figure 2B:
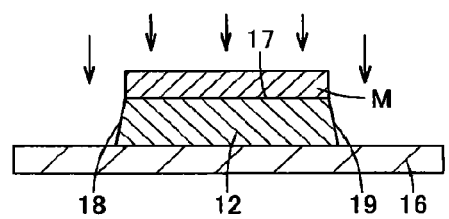
Figure 2C:
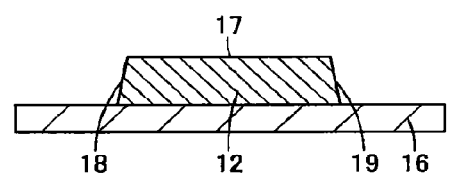

The deposited oxide semiconductor film 27 is patterned by etching such as wet etching, for example. Specifically, the oxide semiconductor film 27 is etched with a given mask M formed on a part of the oxide semiconductor film 27 that is to remain to become the oxide semiconductor layer 12 (FIG. 2B). As described above, the oxide semiconductor film 27 has an oxygen concentration gradient set from the top side to the bottom side. This makes an etching rate differ from the top side to the bottom side. An etching rate becomes relatively high at the top side where an oxygen concentration is relatively high. An etching rate becomes relatively low at the bottom side where the oxygen concentration is relatively low. Thus, the oxide semiconductor film 27 is formed into a tapered shape with the end surfaces 18 and 19 that are inclined so as to diverge from the top side to the bottom side. Then, the mask M is removed and certain reduction treatment is performed to make a resistance lower in opposite regions than in the central part, thereby forming the source region 12s and the drain region 12d. Further, the channel region 12c of a relatively high resistance is formed between the source region 12s and the drain region 12d, thereby forming the oxide semiconductor layer 12 (FIG. 2C).

Figure 2D:
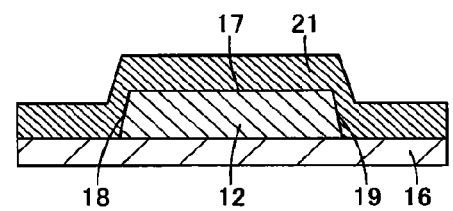
Figure 3A:
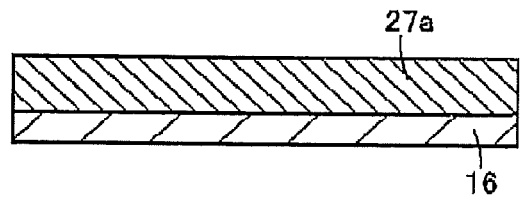
FIGS. 3A, 3B, 3C and 3D are sectional views schematically showing a part of a method of manufacturing a thin-film transistor of a conventional example in order from FIG. 3A to 3D.
Figure 3B:
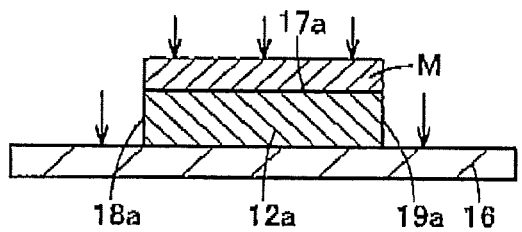
Figure 3C:
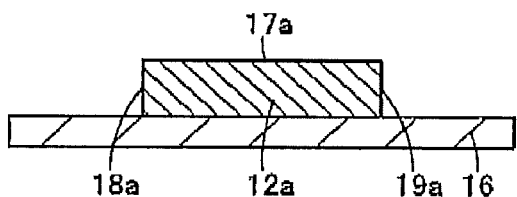
Figure 3D:
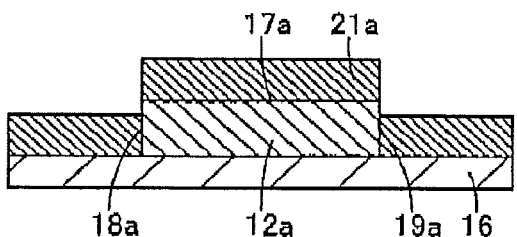

Further, the gate insulating film 21 is deposited on the glass substrate 16 so as to cover the oxide semiconductor layer 12 and then patterned (FIG. 2D). The gate electrode 13 is deposited on the gate insulating film 21 by sputtering, for example, and then patterned. If the gate insulating film 21 is to be formed only under the gate electrode 13, the gate insulating film 21 and the gate electrode 13 can be patterned together.

Then, the interlayer insulating film 22 is deposited on the gate insulating film 21 so as to cover the gate electrode 13 and then patterned. Further, the contact holes 24 and 25 are formed for example by etching in each of the gate insulating film 21 and the interlayer insulating film 22 at positions corresponding to the source region 12s and the drain region 12d of the oxide semiconductor layer 12, respectively. A given metal layer is deposited for example by sputtering so as to cover the contact holes 24 and 25 and then patterned for example by etching. As a result, the source electrode 14 and the drain electrode 15 are each formed into an island-shape, for example, so as to be electrically connected to the source region 12s and the drain region 12d, respectively.

According to the embodiment explained above, the oxide semiconductor film 27 formed to have an oxygen concentration that becomes lower from the top side to the bottom side is etched with the given mask M formed on the oxide semiconductor film 27. By using the difference in etching rate generated by the difference in oxygen concentration, the resultant oxide semiconductor layer 12 is formed with the end surfaces 18 and 19 inclined so as to diverge from the top side to the bottom side. This prevents a disconnection in the gate insulating film 21 covering the oxide semiconductor layer 12 in the range from the upper surface 17 to each of the end surfaces 18 and 19 that is to occur at a step portion including a part covering the oxide semiconductor layer 12 at the upper surface 17 and a part covering the oxide semiconductor layer 12 from each of the end surfaces 18 and 19 to the glass substrate 16 in a layer under the oxide semiconductor layer 12.

Referring to a conventional example shown as Comparative Example in FIGS. 3A, 3B, 3C and 3D, an oxide semiconductor film 27a has an oxygen concentration substantially constant across a range from the top side to the bottom side. Thus, in the case of an etching rate that becomes high particularly during wet etching, for example, the shape of an end surface 18a and that of an end surface 19a of the thin oxide semiconductor film 27a (oxide semiconductor layer 12a) cannot be controlled easily to form the end surfaces 18a and 19a as vertical end surfaces. This causes a disconnection (step disconnection) in a gate insulating film 21a in a layer above the oxide semiconductor layer 12a between a part covering the oxide semiconductor layer 12a at an upper surface 17a and a part covering the oxide semiconductor layer 12a from each of the end surfaces 18a and 19a to the glass substrate 16 in a layer under the oxide semiconductor layer 12a. In contrast, the occurrence of this disconnection does not occur in this embodiment.

As a result, reliability can be enhanced by preventing reduction in insulating properties due to the disconnection in the gate insulating film 21 or preventing reduction in insulating properties of the interlayer insulating film 22 formed in a layer above the gate insulating film 21 by preventing the occurrence of a void in the interlayer insulating film 22, for example.

The oxide semiconductor film 27 can be formed easily in a manner such that an oxygen concentration in the oxide semiconductor film 27 becomes lower from the top side to the bottom side by depositing the oxide semiconductor film 27 while changing an oxygen flow rate.

In the aforementioned embodiment, even if the thin-film transistor 11 is a bottom gate thin-film transistor including the gate electrode 13 arranged below the oxide semiconductor layer 12, the thin-film transistor 11 can still be formed in the same way.

The covering layer covering the oxide semiconductor layer 12 in the range from the upper surface 17 to each of the end surfaces 18 and 19 is not limited to the gate insulating film 21 but it may alternatively be any layer above the oxide semiconductor layer 12.

Further, the covering layer is not always required to cover the entire upper surface 17 as long as it covers the oxide semiconductor layer 12 in a range from at least a part of the upper surface 17 to each of the end surfaces 18 and 19.

The oxide semiconductor film 27 may alternatively be formed by doping, for example, in a manner such that an oxide concentration becomes lower continuously or stepwise from the top side to the bottom side.

While a certain embodiment of the present invention has heretofore been described, the embodiment has been presented by way of example only and is not intended to limit the scope of the invention. For example, the display device may be an organic EL display device and the like, in place of the liquid crystal display device. Indeed, the novel embodiment described herein may be embodied in a variety of other forms; furthermore, various omissions, substitutions, and variations may be made without departing from the spirit of the invention. The appended claims and their equivalents are intended to cover the embodiment and its modifications as would fall within the scope and spirit of the invention.

What is claimed is:

1. A method of manufacturing a thin-film transistor comprising an oxide semiconductor layer including a channel region, a source region, and a drain region, the channel region being placed between the source region and the drain region; a covering layer being a gate insulating film that covers the oxide semiconductor layer in a range including an end surface of the oxide semiconductor layer; a gate electrode arranged at a position spaced from the channel region of the oxide semiconductor layer so as to face the channel region; a source electrode electrically connected to the source region of the oxide semiconductor layer; and a drain electrode electrically connected to the drain region of the oxide semiconductor layer, the method comprising:

forming an oxide semiconductor film in a manner such that the oxygen concentration becomes lower continuously from the top side to the bottom side in all of the channel region, the source region, and the drain region by depositing the oxide semiconductor film while changing an oxygen flow rate continuously, wherein the oxide semiconductor film is etched with a given mask formed on the oxide semiconductor film to form the oxide semiconductor layer with the end surface inclined so as to diverge from the top side to the bottom side, the covering layer is formed so as to cover the oxide semiconductor layer in the range including the end surface, and contact holes are formed on the covering layer, and, through the contact holes, the source electrode is electrically connected to the source region and the drain electrode is electrically connected to the drain region.

2. The method of manufacturing the thin-film transistor according to claim 1, wherein the oxide semiconductor layer is formed of an oxide containing at least one of indium, gallium, zinc, and tin.

3. The method of manufacturing the thin-film transistor according to claim 1, wherein an etching rate changes in accordance with an oxygen concentration of the oxide semiconductor layer.

\* \* \* \* \*